(12) United States Patent
Andrejewski et al.

(10) Patent No.: US 7,270,706 B2
(45) Date of Patent: Sep. 18, 2007

(54) ROLL CRUSHER TO PRODUCE HIGH PURITY POLYCRYSTALLINE SILICON CHIPS

(75) Inventors: Douglas Andrejewski, Hemlock, MI (US); Thomas Dubay, Saginaw, MI (US); Terence Lee Horstman, Frankenmuth, MI (US); Roger Dale Spencer, Jr., Midland, MI (US)

(73) Assignee: Dow Corning Corporation, Midland, MI (US)

( * ) Notice: Subject to any disclaimer, the term of this patent is extended or adjusted under 35 U.S.C. 154(b) by 102 days.

(21) Appl. No.: 11/231,058

(22) Filed: Sep. 20, 2005

(65) Prior Publication Data

US 2006/0070569 A1    Apr. 6, 2006

Related U.S. Application Data

(60) Provisional application No. 60/615,830, filed on Oct. 4, 2004.

(51) Int. Cl.
*C30B 15/20* (2006.01)
*C30B 35/00* (2006.01)

(52) U.S. Cl. .......................... 117/20; 117/19; 117/200; 117/206; 117/900

(58) Field of Classification Search ................ 117/200, 117/206, 900, 19, 20
See application file for complete search history.

(56) References Cited

U.S. PATENT DOCUMENTS

| | | | |
|---|---|---|---|
| 3,905,556 A | 9/1975 | Drage | |
| 4,588,571 A | 5/1986 | Bildl et al. | |
| 4,971,654 A | 11/1990 | Schnegg et al. | |
| 5,064,076 A | 11/1991 | Braun et al. | |
| 5,165,548 A | 11/1992 | Dumler et al. | |
| 5,791,493 A | 8/1998 | Meyer | |
| 5,851,303 A | 12/1998 | Hwang et al. | |
| 6,004,402 A | 12/1999 | Cercone et al. | |
| 6,170,171 B1 | 1/2001 | Schmidbauer et al. | |
| 6,309,467 B1 | 10/2001 | Wochner et al. | |
| 6,313,013 B1 | 11/2001 | Flottmann et al. | |
| 2001/0159647 | 8/2003 | Arvidson et al. | |

(Continued)

FOREIGN PATENT DOCUMENTS

CA         954425        9/1974

(Continued)

OTHER PUBLICATIONS

DL Williams Company, product website for Single Roll Crusher by American Pulverizer Company.

(Continued)

*Primary Examiner*—Felisa Hiteshew
(74) *Attorney, Agent, or Firm*—Catherine U. Brown

(57) ABSTRACT

A single roll crusher for comminuting high purity materials includes a roll with teeth spaced around the circumference of the roll. The roll is rotatably mounted inside a housing. The housing has a top with an entrance port, sides, and bottom with an exit port. The roll, teeth, and at least the inside surfaces of the top, sides, and bottom are fabricated from a material of construction that minimizes contamination of silicon. The material of construction may be tungsten carbide with a cobalt binder. The single roll crusher is used for processing polycrystalline silicon.

17 Claims, 3 Drawing Sheets

U.S. PATENT DOCUMENTS

2004/0035960 A1    2/2004    Arvidson et al.

FOREIGN PATENT DOCUMENTS

EP    0539097 B1    11/1994
JP    05-004811    1/1993

OTHER PUBLICATIONS

Pennsylvania Crusher, product website for Single Roll Crushers.
Aubema Crushing Technology, product website for Roll Crushers.

ROLL CRUSHER TO PRODUCE HIGH PURITY POLYCRYSTALLINE SILICON CHIPS

CROSS-REFERENCE TO RELATED APPLICATIONS

This application claims priority to U.S. Provisional Patent Application Ser. No. 60/615,830, filed on 4 Oct. 2004. U.S. Provisional Patent Application Ser. No. 60/615,830 is hereby incorporated by reference.

STATEMENT REGARDING FEDERALLY SPONSORED RESEARCH OR DEVELOPMENT

Not applicable.

BACKGROUND OF THE INVENTION

1. Technical Field of the Invention

This invention relates to a single roll crusher for comminution of high purity materials, such as polycrystalline silicon.

2. Background

Most semiconductor chips used in electronic devices are fabricated from single crystal silicon prepared by a Czochralski-type (CZ) process. In the CZ process, a single crystal silicon ingot is produced by melting polycrystalline silicon source material in a crucible, stabilizing the crucible and source melt at an equilibrium temperature, dipping a seed crystal into the source melt, withdrawing the seed crystal as the source melt crystallizes on the seed to form a single crystal ingot, and pulling the ingot as it grows. Melting occurs at a temperature of 1420° C. in an inert gas environment at low pressure. The crucible is continually rotated about a generally vertical axis as the crystal grows. The rate at which the ingot is pulled from the source melt is selected to form an ingot having a desired diameter.

Polycrystalline silicon rods useful as or for preparing the source material can be prepared by methods known in the art. For example, polycrystalline silicon rods can be prepared by a chemical vapor deposition (CVD) process comprising chemical vapor deposition of a high purity chlorosilane or silane gas onto a heated substrate, see *Handbook of Semiconductor Silicon Technology*, edited by William C. O'Mara, Robert B. Herring, and Lee P. Hunt, Noyes Publications, Park Ridge, N.J., U.S.A., 1990, Ch. 2, pp. 39-58. The polycrystalline silicon prepared by the CVD process can be comminuted into suitably sized pieces such as rods, chunks, chips, and combinations thereof, before loading into the crucible. The polycrystalline silicon is melted to form the molten silicon.

Methods to comminute the polycrystalline silicon rods to prepare the chunks, chips, and other suitably sized pieces suffer from various drawbacks. The polycrystalline silicon rods can be comminuted, for example, by striking with a low-contamination impact tool such as that disclosed in EP 0 539 097 A1. This is a labor intensive process. Alternatively, the polycrystalline silicon rods may be comminuted using a jaw crusher. Jaw crushers may be inefficient when used to comminute polycrystalline silicon, for example, up to 3% of the polycrystalline silicon may be lost as dust and fines too small to be useful in the CZ process. Alternatively, the polycrystalline silicon rods may be comminuted by striking with a low-contamination impact tool and the resulting comminuted rods may be further comminuted using a jaw crusher.

Problem to be Solved

The problem to be solved by this invention is to improve efficiency of a process to comminute high purity materials while minimizing contamination of the high purity materials.

Solution

BRIEF SUMMARY OF THE INVENTION

A single roll crusher has parts fabricated from a material of construction that minimizes contamination, and these parts contact the high purity materials to be comminuted, such as polycrystalline silicon.

DETAILED DESCRIPTION OF THE INVENTION

All amounts, ratios, and percentages are by weight unless otherwise indicated. The following is a list of definitions, as used herein.

Definitions

"Comminute" means to break up, chop, or grind into small particles. Comminute includes any method for reducing polycrystalline silicon into pieces, including but not limited to cutting polycrystalline silicon rods and then further breaking them by various methods.

The disclosure of ranges includes the range itself and also anything subsumed therein, as well as endpoints. For example, disclosure of a range of 4 to 12 includes not only the range of 4 to 12, but also 4, 5.7, 11 and 12 individually, as well as any other number subsumed in the range. Furthermore, disclosure of a range of, for example, 4 to 12 includes the subranges of, for example, 4 to 8, 9 to 10, 9 to 12, and 10 to 12, as well as any other subrange subsumed in the range. Similarly, the disclosure of Markush groups includes the entire group and also any individual members and subgroups subsumed therein. For example, disclosure of the Markush group tungsten carbide, tungsten carbide with a cobalt binder, tungsten carbide with a nickel binder, $Cr_3C_2$, $Cr_3C_2$ with nickel chrome alloy binder, or combinations thereof includes the member tungsten carbide individually; the subgroup tungsten carbide, tungsten carbide with a cobalt binder, and $Cr_3C_2$; and any other individual member and subgroup subsumed therein.

Single Roll Crusher

FIG. 1 represents a side cross sectional view of a single roll crusher 100 of this invention. The single roll crusher 100 includes a roll 101 with teeth 102 spaced around the circumference of the roll 101. The roll 101 is rotatably mounted inside a housing 103 on a shaft 104. Set screws 105 mounted on shaft 104 maintain the position of the roll 101 on the shaft 104.

The housing 103 comprises a top 106 having an entrance port 107, sides 108, and bottom 109 having an exit port 110. The top 106, sides 108, and bottom 109 define a cavity inside the housing 103 in which the roll 101 is mounted. The roll 101, teeth 102, and at least the inside surfaces 112 of top 106, sides 108, and bottom 109 comprise materials that minimize contamination of silicon. Polycrystalline silicon rods 111' may be fed into the single roll crusher 100 through the entrance port 107. Polycrystalline silicon pieces 111 that have been processed through the single roll crusher 100 exit through the exit port 110.

The inside surface 112 of side 108 opposite the roll 101 comprises a flat plate 113 mounted to a movable assembly 114. The movable assembly 114 allows the distance between the flat plate 113 and the roll 101 to be adjusted such that the size of the polycrystalline silicon pieces 111 may be controlled.

FIG. 2 shows a side cross sectional view of an alternative single roll crusher 200 according to this invention. In this single roll crusher 200, the plate 213 mounted to the movable assembly 114 is tapered to be wider at the entrance port 107. This design may allow for easier loading of polycrystalline silicon rods 111' into the single roll crusher 200.

The parts of the single roll crusher that contact polycrystalline silicon comprise a material of construction that minimizes contamination of silicon, such as materials possessing a hardness greater than or comparable to polycrystalline silicon. These portions (e.g., the roll 101, teeth 102, and inside surfaces 112 forming the cavity) may comprise carbides, cermets, ceramics, and combinations thereof. For example, the material of construction may comprise tungsten carbide; tungsten carbide with a cobalt binder; tungsten carbide with a nickel binder; titanium carbide; $Cr_3C_2$; $Cr_3C_2$ with nickel-chrome alloy binder; tantalum carbide; niobium carbide; silicon nitride; silicon carbide in a matrix such as Fe, Ni, Al, Ti, or Mg; aluminum nitride; tantalum carbide; niobium carbide; titanium carbide with cobalt and titanium carbonitride; nickel; nickel-cobalt alloy; iron; and combinations thereof. These parts may be made of, or clad with, the material of construction. Use of tungsten carbide containing materials may reduce the level of iron contaminants imparted to silicon by the comminuting process.

The inside surfaces 112 forming the cavity and a hopper for supplying polycrystalline silicon rods or oversize polycrystalline silicon pieces, or both, and a discharge chute can be made of, or clad with, the same material of construction as the roll 101 or any other material of construction that minimizes contamination of silicon. Such materials of construction include ultra high molecular weight polyethylene (UHMWPE), polypropylene, perfluoroalkoxy resin (PFA), polyurethane (PU), polyvinylidene difluoride (PVDF), TEFLON®, tungsten carbide, silicon, and ceramic.

FIG. 3 shows a perspective view of a roll 101 for use in the single roll crusher 100 shown in FIG. 1. The roll 101 has teeth 102 that span the frill width of the roll 101.

FIG. 4 shows a perspective view of a set of disks 401 forming a roll 101 for use in the single roll crusher 200 shown in FIG. 2. The disks 401 are mounted adjacent one another such that the teeth 102 are offset from one another.

FIG. 5 shows a perspective view of a set of sheets 501 forming a concave plate 513 arrayed in a portion of a housing 503. FIG. 6 shows a perspective view of a cross section of one sheet 501 in the concave plate 513 of FIG. 5. The concave plate 513 may be used instead of the flat plate 113 in the single roll crusher 100 in FIG. 1 or the tapered plate 213 in the single roll crusher 200 in FIG. 2. Each sheet 501 has a concave surface 514 having a vertical ridge 515 thereon.

One skilled in the art would recognize that the description of FIGS. 3 and 4 is exemplary and not limiting. Alternatively, the roll may be a solid roll with offset teeth, rather than a set of disks. When a set of disks is used to form the roll, more or fewer than 3 disks, as shown in FIG. 4, may be used. One skilled in the art would recognize that the description of FIGS. 5 and 6 is exemplary and not limiting. Plates having different shapes and surface features may be used in the single roll crusher for this invention.

Methods of Use

The single roll crusher of this invention may be used in addition to, or instead of, a jaw crusher in the process to make flowable chips described in U.S. patent application Ser. No. 10/298129 corresponding to Publication No. 2003-0159647, published on 28 Aug. 2003; which is hereby incorporated by reference. The single roll crusher may be used in addition to, or instead of, the thermal shock process described in U.S. patent application Ser. No. 10/227362 corresponding to Publication No. 2004-0035960, published on 26 Feb. 2004; which is hereby incorporated by reference.

Polycrystalline silicon pieces, including but not limited to flowable chips, may be prepared by a method comprising:
a) comminuting polycrystalline silicon rods, and
b) sorting the product of step a) to obtain a controlled particle size distribution of polycrystalline silicon pieces, and
optionally c) removing impurities from the product of step a) or step b), or both. Step a) comprises using a single roll crusher described above. Step b) may further include air classification for removal of dust. Step c) may include exposing the product of step a) or step b), or both, to a magnetic field.

Comminuting Polycrystalline Silicon Rods

Step a) may be performed by feeding polycrystalline silicon rods into a single roll crusher described above. Alternatively, the polycrystalline silicon rods may be comminuted by striking with a low-contamination impact tool and the resulting comminuted rods may be further comminuted using a single roll crusher described above. Alternatively, the polycrystalline silicon rods may be comminuted by cutting with a saw, and thereafter optionally striking with a low-contamination impact tool, and thereafter further comminuted using a single roll crusher described above. The polycrystalline silicon may be fed to the single roll crusher by any convenient means, such as a hopper, a chute, or a conveyor such as a bucket, belt, or vibratory conveyor.

One skilled in the art would recognize that multiple single roll crushers may be used in series to obtain a desired size distribution or to recycle oversize polycrystalline silicon pieces, or both.

Sorting the Polycrystalline Silicon Pieces

The polycrystalline silicon pieces can be sorted manually or by use of an apparatus, such as the rotary silicon screen disclosed in U.S. Pat. No. 5,165,548 or the sorting apparatus disclosed in U.S. Pat. Nos. 3,905,556; 5,064,076; or 5,791,493 provided that the portions of the sorting apparatus that contact silicon comprise materials of construction that minimize contamination of silicon, such as those discussed above. Alternatively, the polycrystalline silicon pieces may be sorted using a step deck classifier. Alternatively, the polycrystalline silicon pieces may be sorted using a rotary indent classifier.

Optional Removal of Contaminants

Although the single roll crusher is designed to minimize contamination of the polycrystalline silicon pieces, the polycrystalline silicon pieces may be treated to remove contaminants, thereby further improving purity. The polycrystalline silicon pieces optionally can be exposed to a magnetic field to remove contaminants. For example, the polycrystalline silicon pieces can be passed through a chamber containing a magnet to remove contaminants, or a magnet may be passed over the polycrystalline silicon pieces. The magnet may be a rare earth magnet or an electromagnet, or combinations thereof. The magnet may directly contact the polycrystalline silicon pieces or be in the near vicinity of the polycrystalline silicon pieces. The magnets remove much of the fine particulate having an appropriate susceptibility to the magnetic field. These particulates include ferromagnetic impurities such as iron and cobalt and paramagnetic impurities such as tungsten carbide, and other ferromagnetic impurities and paramagnetic impurities used in manufacture of materials of construction for the single roll crusher used to comminute the silicon.

Depending on the purity of the polycrystalline silicon rods used as the starting material and methods used to comminute and sort the polycrystalline silicon pieces, the polycrystalline silicon pieces at this step may have purity sufficient for use in preparing solar cell grade monocrystalline silicon wafers or electronic grade monocrystalline silicon wafers. However, if purity is insufficient for electronic grade applications, or both of these applications, the silicon may be surface cleaned to further remove impurities.

Optional Surface Cleaning

The polycrystalline silicon pieces can be surface cleaned by methods known in the art. Surface cleaning may be carried out in addition to, or instead of, the removal of contaminants method described above. For example, the polycrystalline silicon pieces can be cleaned by the process disclosed in U.S. Pat. No. 5,851,303 which comprises sequentially contacting the polycrystalline silicon pieces with gaseous hydrogen fluoride and then with an aqueous solution comprising at least one half percent hydrogen peroxide, and thereafter drying the broken rods. Alternatively, the polycrystalline silicon pieces can be cleaned by the process disclosed in JP Hei-05-4811. Alternatively, the polycrystalline silicon pieces can be surface cleaned by anisotropic etching as described in Canadian Patent No. 954425 or U.S. Pat. No. 4,971,654. Other suitable surface cleaning methods include those disclosed by U.S. Pat. Nos. 4,588,571 and 6,004,402.

Packaging

The method may further comprise d) packaging the resulting polycrystalline silicon pieces. The resulting polycrystalline silicon pieces may be packaged by any convenient means, for example, manually or automatically placing the polycrystalline silicon pieces in polyethylene bags.

The method of this invention may be used to make flowable chips, such as those described in U.S. patent application Ser. No. 10/298129 filed on 14 Nov. 2002. Flowable chips are polycrystalline silicon pieces having a controlled particle size distribution. The controlled particle size distribution can be 0.2 to 250 mm, alternatively 0.2 to 45 mm, alternatively 8 to 45 mm, alternatively 1 to 25 mm, alternatively 1 to 20 mm, alternatively 3 to 20 mm, alternatively 4 to 12 mm, alternatively 4 to 10 mm, alternatively 1 to 12 mm, and alternatively 1 to 8 mm. However, the exact controlled particle size distribution will be selected based on various factors including the method in which the flowable chips will be used and the apparatus used to feed them. For example, flowable chips that will be used in a CZ process, or in electronic grade applications, or both, may have a controlled particle size distribution of 2 to 45 mm. Alternatively, flowable chips that will be used in a solar grade application, such as a casting process, can have a controlled particle size distribution of 0.2 to 45 mm.

INDUSTRIAL APPLICABILITY

The single roll crusher of this invention comminutes polycrystalline silicon with minimal contamination. The single roll crusher may have improved durability over other roll crushers that do not have parts that contact the polycrystalline silicon fabricated from the materials of construction described above. The single roll crusher may provide improved yield over jaw crushers in that losses of polycrystalline silicon as dust and fines too small to be used in a CZ process. For example, this loss may be 1.5 to 3% for a jaw crusher as compared to less than 1% for the single roll crusher of this invention. The single roll crusher is smaller in scale and simpler in design than many commercial roll crushers, (e.g., double roll crushers) thus making it feasible to fabricate the entire crushing cavity and roll out of a solid tungsten carbide containing material of construction. The single roll crusher of this invention may provide the advantage that all machine adjustments are isolated from the crushing chamber. Without wishing to be bound by theory, it is thought that the single roll crusher and method of this invention may be used to retain purity of the polycrystalline silicon.

DRAWINGS

Figure 2:
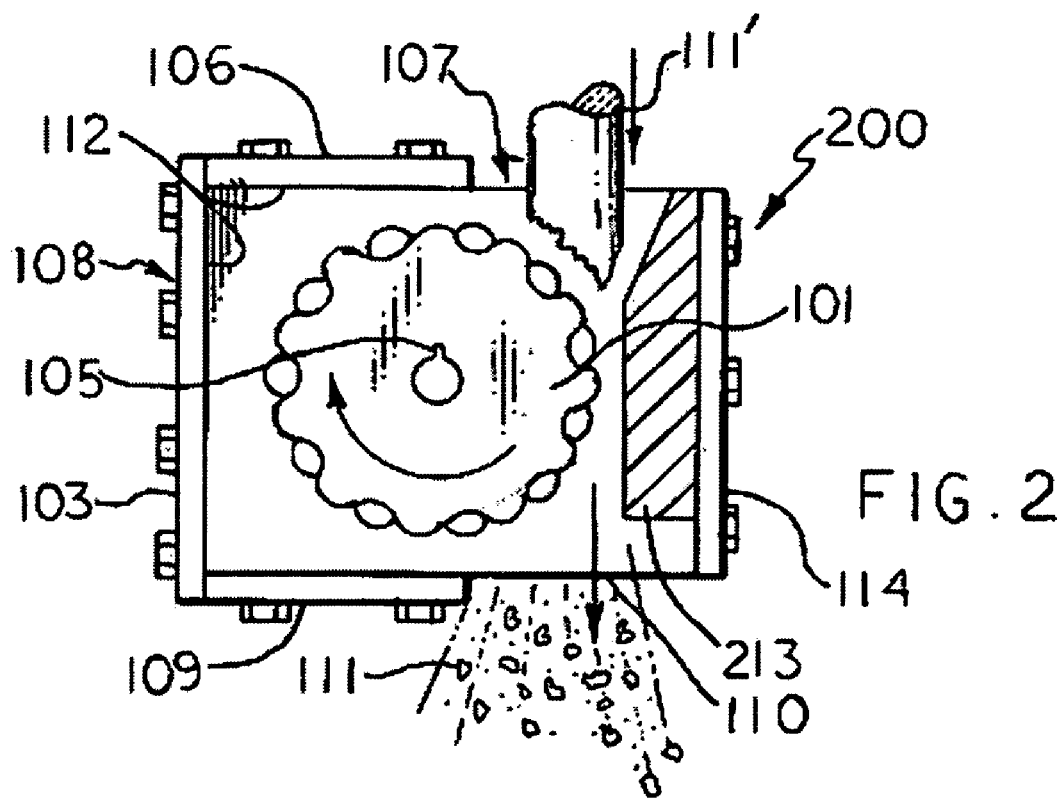
FIG. 2 represents a side cross sectional view of a single roll crusher 200 of this invention.
Figure 3:
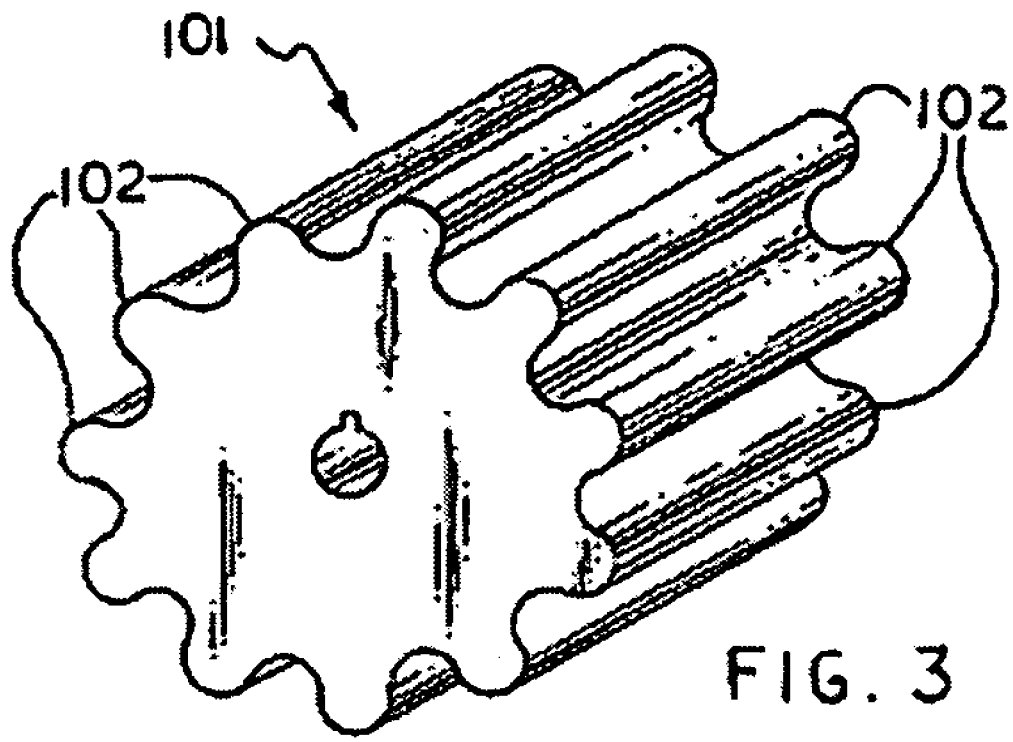
FIG. 3 represents a perspective view of a roll 101 for use in the single roll crusher 100 in FIG. 1.
Figure 4:
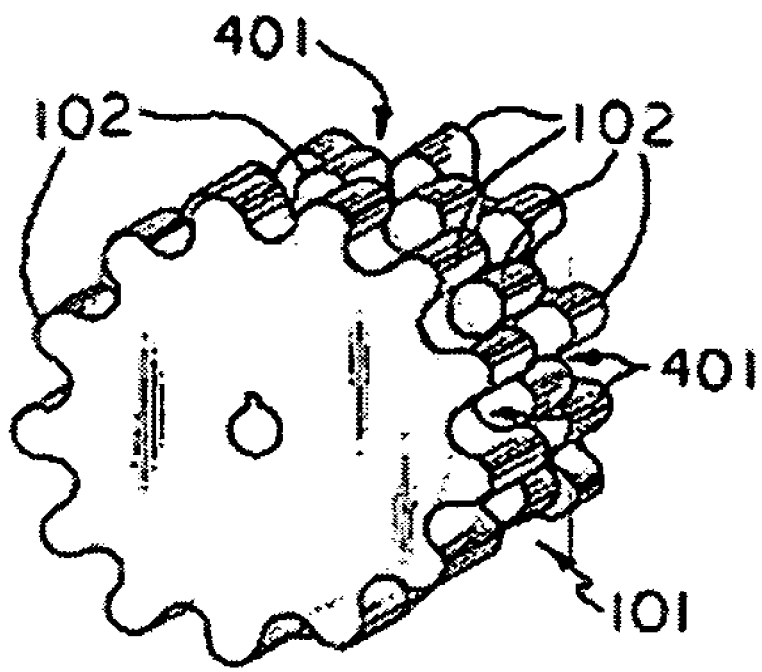

FIG. 4 represents a perspective view of a set of disks 401 forming a roll 101 for use in the single roll crusher 200 in FIG. 2.

Figure 1:
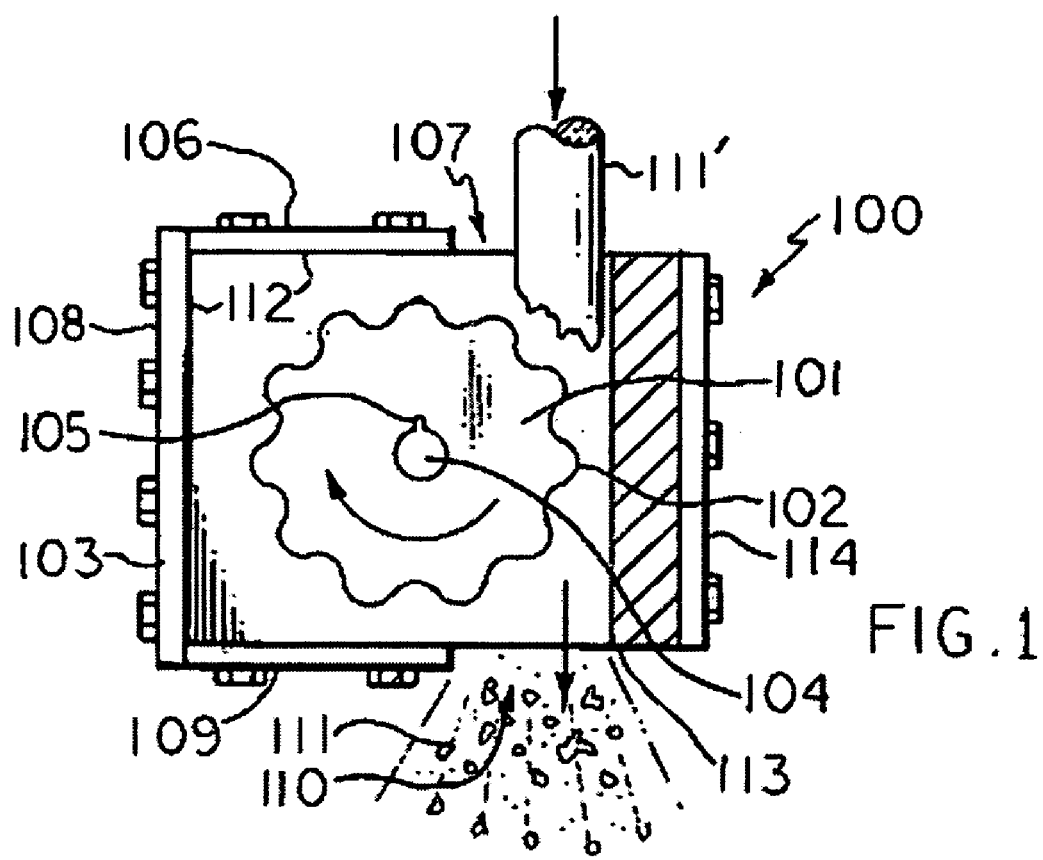
FIG. 1 represents a side cross sectional view of a single roll crusher 100 of this invention.
Figure 5:
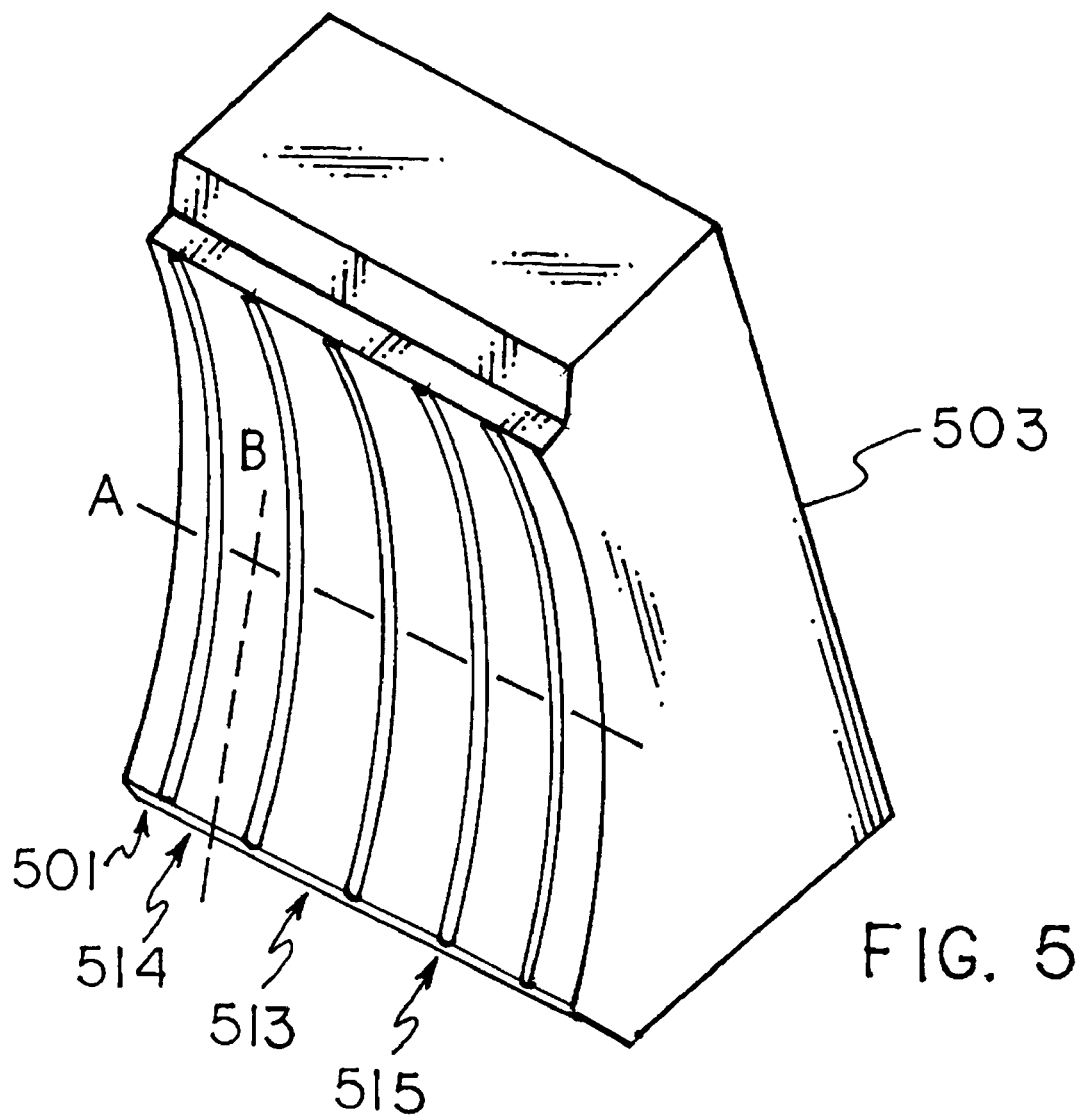

FIG. 5 represents a perspective view of a set of sheets 501 forming a concave plate 513 for use in the single roll crusher 100 in FIG. 1 or the single roll crusher 200 in FIG. 2.

Figure 6:
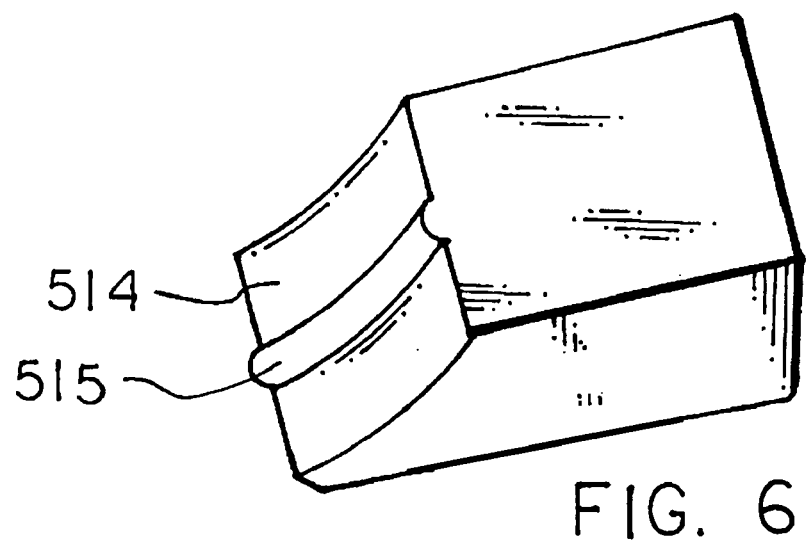

FIG. 6 represents a perspective view of a cross section of one sheet 501 of FIG. 5.

REFERENCE NUMERALS

100 single roll crusher
101 roll
102 teeth
103 housing
104 shaft
105 set screw
106 top of housing
107 entrance port
108 sides of housing
109 bottom of housing
110 exit port
111 polycrystalline silicon pieces
111' polycrystalline silicon rods
112 inside surface
113 flat plate
114 movable assembly 200 single roll crusher
213 tapered plate
401 disk
501 sheet
503 housing
513 concave plate
514 concave surface
515 vertical ridge

The invention claimed is:

1. A method comprising:
   a) comminuting polycrystalline silicon rods using an apparatus comprising:
      a roll,
      teeth spaced around the circumference of the roll,
      a shaft on which the roll is rotatably mounted
      a housing having surfaces defining a cavity inside which the roll is mounted
      an inlet port on top of the housing,
      an exit port on bottom of the housing,
      a plate inside the housing opposite the roll,
      where the roll, teeth, plate, and housing surfaces defining the cavity are made from or clad with a material of construction that minimizes contamination of polycrystalline silicon,
   b) sorting the product of step a), and
   optionally c) removing impurities from the product of step a) or step b), or both, and
   d) packaging resulting polycrystalline silicon pieces.

2. The method of claim 1, where step b) is performed using a step deck classifier or a rotary indent classifier.

3. The method of claim 1 or 2, where step c) is performed and includes exposing the product of step a) or step b), or both, to a magnetic field.

4. The method of claim 3, where the polycrystalline silicon pieces have particle size ranging from 0.2 to 250 millimeters.

5. The method of claim 2, where the polycrystalline silicon pieces have particle size ranging from 0.2 to 250 millimeters.

6. The method of claim 1, where the polycrystalline silicon pieces have particle size ranging from 0.2 to 250 millimeters.

7. The method of claim 6, where the polycrystalline silicon pieces have particle size ranging from 0.2 to 250 millimeters.

8. An apparatus comprising:
   a roll,
   teeth spaced around the circumference of the roll,
   a shaft on which the roll is rotatably mounted
   a housing having surfaces defining a cavity inside which the roll is mounted
   an inlet port on top of the housing,
   an exit port on bottom of the housing,
   a plate inside the housing opposite the roll,
   where the roll, teeth, plate, and housing surfaces defining the cavity are made from or clad with a material of construction that minimizes contamination of polycrystalline silicon.

9. The apparatus of claim 8, where the plate is flat.

10. The apparatus of claim 8, where the plate is tapered.

11. The apparatus of claim 8, where the plate is concave.

12. The apparatus of claim 8, where the plate has a longitudinal ridge.

13. The apparatus of claim 8, where the teeth span a full width of the roll.

14. The apparatus of claim 8, where the roll comprises a set of disks having teeth, and the teeth in the disks are offset from one another.

15. The apparatus of claim 8, where the material of construction is selected from the group consisting of carbides, cermets, ceramics, and combinations thereof.

16. The apparatus of claim 8, where the material of construction is selected from the group consisting of tungsten carbide; tungsten carbide with a cobalt binder; tungsten carbide with a nickel binder; titanium carbide; $Cr_3C_2$; $Cr_3C_2$ with nickel-chrome alloy binder; tantalum carbide; niobium carbide; silicon nitride; silicon carbide in a matrix selected from Fe, Ni, Al, Ti, or Mg; aluminum nitride; tantalum carbide; niobium carbide; titanium carbide with cobalt and titanium carbonitride; nickel; nickel-cobalt alloy; iron; and combinations thereof.

17. The apparatus of any of claims 8 to 16, where the material of construction is tungsten carbide with a cobalt binder.

* * * * *